(12) United States Patent
Douglas

(10) Patent No.: US 6,730,991 B1
(45) Date of Patent: May 4, 2004

(54) INTEGRATED CIRCUIT CHIP PACKAGE

(75) Inventor: Edward C. Douglas, Andover, MA (US)

(73) Assignee: Raytheon Company, Waltham, MA (US)

( * ) Notice: Subject to any disclaimer, the term of this patent is extended or adjusted under 35 U.S.C. 154(b) by 279 days.

(21) Appl. No.: 08/661,539

(22) Filed: Jun. 11, 1996

(51) Int. Cl.[7] .................. H01L 23/495; H01L 23/48; H01L 23/14; H01L 23/12; H01L 23/52
(52) U.S. Cl. .................. 257/625; 257/707; 257/704; 257/796; 257/710; 257/675; 257/676; 257/693; 257/702; 257/713; 257/729; 257/783; 257/787; 257/668
(58) Field of Search ............... 257/625, 796, 257/710, 668, 675, 676, 693, 702, 704, 707, 713, 729, 783, 787, 728

(56) References Cited

U.S. PATENT DOCUMENTS

| | | | | |
|---|---|---|---|---|
| 4,355,463 A | * | 10/1982 | Burns | |
| 4,441,119 A | | 4/1984 | Link | ............ 357/74 |
| 4,680,613 A | | 7/1987 | Daniels et al. | ............ 357/72 |
| 5,162,896 A | | 11/1992 | Takubo et al. | ............ 257/664 |
| 5,256,901 A | * | 10/1993 | Ohashi et al. | |
| 5,302,852 A | * | 4/1994 | Kaneda et al. | |
| 5,455,386 A | * | 10/1995 | Brathwaite et al. | |
| 5,473,512 A | * | 12/1995 | Degani et al. | |
| 5,477,009 A | * | 12/1995 | Brendecke et al. | |
| 5,485,037 A | * | 1/1996 | Marrs | |
| 5,532,514 A | * | 7/1996 | Kozono | ............ 257/701 |
| 5,557,144 A | * | 9/1996 | Rosenstock et al. | ......... 257/664 |
| 5,586,388 A | * | 12/1996 | Hirao et al. | ............ 174/52.2 |
| 5,586,389 A | * | 12/1996 | Hirao et al. | ............ 29/827 |
| 5,642,261 A | * | 6/1997 | Bond et al. | |
| 5,646,827 A | * | 7/1997 | Hirao et al. | ............ 361/707 |
| 5,731,542 A | * | 3/1998 | Limper-Brenner et al. | |
| 5,767,447 A | * | 6/1998 | Dudderar et al. | |
| 5,998,862 A | * | 12/1999 | Yamanaka | ............ 257/434 |
| 6,300,673 B1 | * | 10/2001 | Hoffman et al. | ............ 257/666 |

FOREIGN PATENT DOCUMENTS

WO     WO 94/17552     8/1994

* cited by examiner

*Primary Examiner*—David E. Graybill
(74) *Attorney, Agent, or Firm*—Daly, Crowley & Mofford, LLP

(57) ABSTRACT

A package for an integrated circuit chip adapted to operate at microwave frequencies. The package includes an electrically conductive lead frame having electrical leads extending outwardly from an inner region. A base section is adhesively affixed to a bottom portion of the lead frame. The base section and a plastic cover are configured to provide a cavity when the cover and the base section are affixed with the integrated circuit chip being disposed with such provided cavity. With another integrated circuit chip package, an electrically conductive lead frame has electrical leads adapted for electrical connection to the integrated circuit chip. The base section includes a conductive member nd a dielectric member. The dielectric member has an aperture disposed in registration with an inner region of the lead frame. The conductive member is electrically to a bottom surface portion of the integrated circuit. The integrated circuit chip being disposed in registration with the aperture. A plastic cover and the base section are configured to provide a cavity when the cover and the bottom are affixed with the integrated circuit chip being disposed with such provided cavity and with a bottom surface portion of the conductive member being exposed exteriorly of the package.

2 Claims, 9 Drawing Sheets

INTEGRATED CIRCUIT CHIP PACKAGE

BACKGROUND OF THE INVENTION

This invention relates to integrated circuit chip packages and more particularly to integrated circuit chip packages adapted for packaging monolithic microwave integrated circuits (MMICs).

As is known in the art, packages are used to protect integrated circuits. Because of their relatively low cost, it is desirable to use plastic for the packages. While transfer molded plastic packages have been used for low frequency integrated circuit chip packages, such technique is not generally suitable for monolithic microwave integrated circuits (MMICs) because the plastic material on electrical wires used to connect the integrated circuit chip to a lead frame and over the surface of the MMIC itself has been found to adversely effect the performance of the integrated circuit. One package which has been suggested for MMICs is discussed in international patent application WO 94/17552 published Aug. 4, 1994. In such patent application, a lead frame having a baseplate for mounting a semiconductor chip is embedded on a surface of a platform of a plastic package.

SUMMARY OF THE INVENTION

In accordance with one feature of the invention, a package for an integrated circuit chip adapted to operate at microwave frequencies is provided. The package includes an electrically conductive lead frame having electrical leads extending outwardly from an inner region. A base section and plastic cover are adhesively bonded with the inner region of the lead-frame disposed therebetween. The base section and the cover are configured to encapsulate the integrated circuit chip within a cavity formed when the cover and the base section are bonded to provide the package.

With such a package, a low cost, electrically effective MMIC package is provided.

In one embodiment of the invention, the base section includes a dielectric member and in another embodiment the base section includes a dielectric member and a conductive member.

In accordance with another feature of the invention, a method for packaging an integrated circuit chip adapted to operate at microwave frequencies is provided. The method includes providing a lead frame having electrical leads extending outwardly from an inner region of the lead frame; affixing a base section to the lead frame with portions of the electrical leads extending outwardly from the base section and mounting the integrated circuit chip to the platform. Electrical wires are connected between the integrated circuit chip and the electrical leads. The base section and the cover are adhesively bonded with the integrated circuit chip and the electrical wires connected thereto disposed within a cavity formed by the affixed base section and cover.

With such method a relatively simple, low cost packaging technique is provided.

In accordance with another feature of the invention, a package for an integrated circuit chip adapted to operate at microwave frequencies is provided. The package includes an electrically conductive lead frame having electrical leads adapted for electrical connection to the integrated circuit. The base section includes an electrically conductive member and a dielectric member, such dielectric member having an aperture therein. The dielectric member aperture is disposed in registration with an inner region of the lead frame. An upper surface portion of the conductive member is adhesively bonded to a bottom surface portion of the dielectric member. Another upper surface portion of the conductive member is adapted for electrical connection to a bottom ground plane of the integrated circuit with such integrated circuit chip disposed in registration with the aperture. A plastic cover is adhesively affixed to upper portions of the lead frame and upper portions of the dielectric member, the plastic cover being configured to provide a cavity when the cover and the base section are affixed with the integrated circuit chip being disposed with such provided cavity and with a bottom surface portion of the conductive member being exposed exteriorly of the package to provide a ground plane connector for the bottom ground plane of the integrated circuit.

With such package, the bottom ground plane of the integrated circuit chip may be easily connected to the ground plane provided by the conductive member.

In accordance with another feature of the invention, a method is provided for packaging an integrated circuit chip adapted to operate at microwave frequencies. The method includes the steps of: providing a lead frame having electrical leads extending outwardly from an inner region of the lead frame; providing a base section having a conductive member and a dielectric member, the dielectric member having an aperture; connecting electrical wires between the integrated circuit chip and the electrical leads and a bottom ground plane of the integrated circuit chip to the electrically conductive member with the integrated circuit chip being in registration with the aperture; and, adhesively affixing the base section to a plastic cover to provide a package for the integrated circuit chip and the electrical wires connected thereto within a cavity provided by adhesively affixed base section and dielectric cover with a portion of the electrically conductive member being exposed exteriorly of the package.

With such method the bottom surface of the integrated circuit chip may be easily grounded externally using a surface external to the package.

In accordance with still another feature of the invention, a package an integrated circuit chip adapted to operate at microwave frequencies is provided. The package includes: (a) a lead frame having electrical leads extending outwardly from an inner region of the lead frame; (b) a base section comprising: a dielectric member having an aperture and; an electrically conductive member having an upper surface adapted for electrical connection to a bottom ground plane of the integrated circuit chip when the integrated circuit chip is in registration with the aperture; and (c) a dielectric cover, such cover being configured to provide a cavity for the integrated circuit chip when the cover and the base section are affixed and to expose a bottom portion of the conductive member exteriorly of the package.

BRIEF DESCRIPTION OF THE DRAWING

These and other advantages of the invention will become more readily apparent from the following detailed description taken together with the accompanying drawings, in which:

FIG. 4B being a cross-sectional elevation sketch showing the relationship between the conductive member of the base section of the package of FIG. 3A and the adhesively affixed dielectric member and lead frame of FIG. 4C after the two have been adhesively affixed together, and FIG. 4F being a cross-sectional elevation sketch showing the relationship between a cover of the package of FIG. 3A and the lead frame of FIG. 3A prior the to affixation therebetween.

DESCRIPTION OF THE PREFERRED EMBODIMENT

Figure 1A:
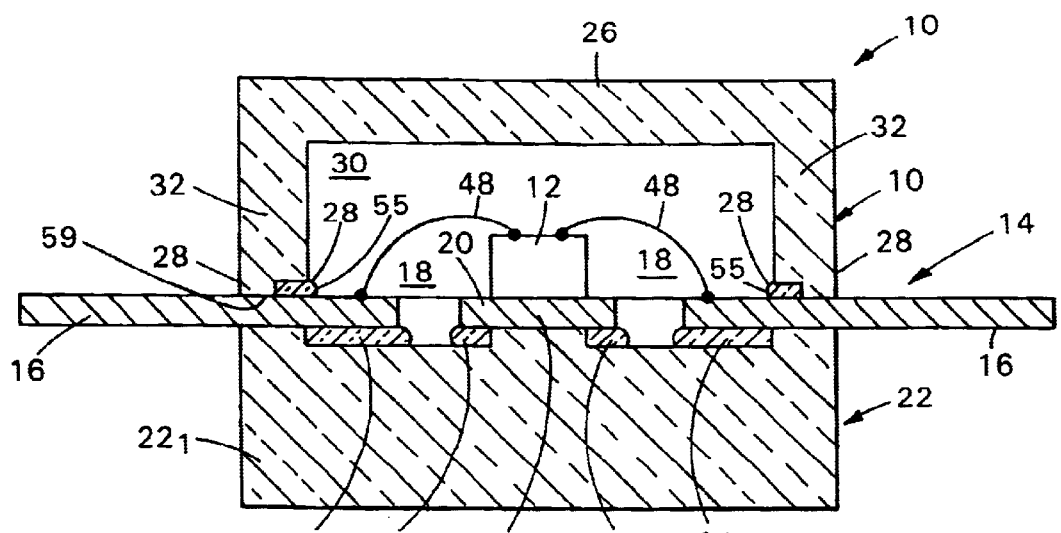
FIG. 1A is a cross-sectional elevation, diagrammatical sketch of a package for an integrated circuit adapted to operate at microwave frequencies.
Figure 1B:
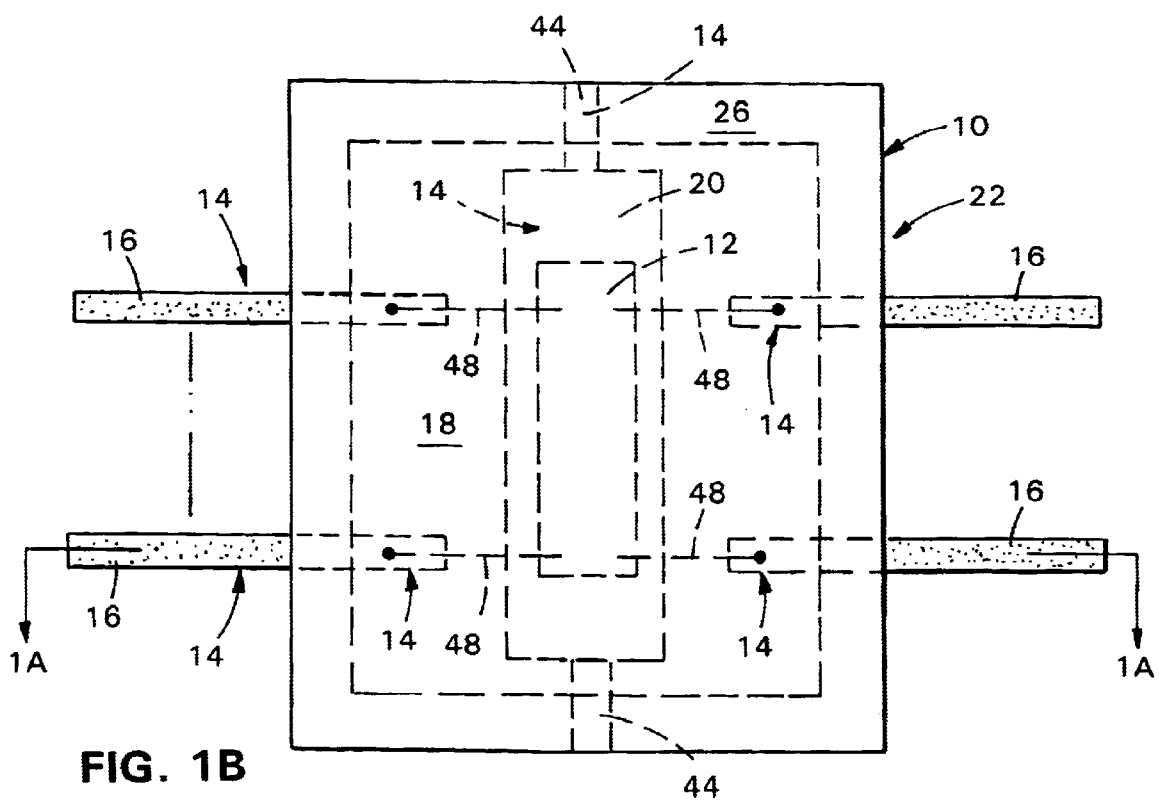
FIG. 1B is a plan view of the package of FIG. 1A, the cross sectional view of FIG. 1A being taken along line 1A—1A of FIG. 1B.

Referring now to FIGS. 1A and 1B, a package 10 for an integrated circuit chip 12, here an MMIC, adapted to operate at microwave frequencies, is shown. The package 10 includes an electrically conductive lead frame 14 having electrical leads 16 extending outwardly from an inner region 18 thereof and a mounting platform 20 disposed with the inner region 18. The platform 20 has mounted to an upper surface portion thereof the integrated circuit chip 12, as shown.

The package 10 also includes a base section 22, here a dielectric member $22_1$. Here dielectric member $22_1$ is plastic and is adhesively affixed by a B-stage epoxy 24 onto a bottom surface portion of the platform 20 and onto bottom portions of the electrical leads 16. A dielectric cover 26, here plastic, is adhesively affixed to the dielectric member $22_1$ with a B-stage epoxy 28. The base section 22 and the cover 26 are configured to provide package 10 with an air-filled cavity 30 when the cover 26 and the base section 22 are affixed together with the integrated circuit chip 12 being encapsulated within the provided cavity 30, as shown.

As noted in FIGS. 1A and 1B, the cover 26 of package 10 has a recess disposed within sidewalls 32 and ends of the sidewalls 32 are affixed to the base section member 22 to encapsulate the integrated circuit chip 12 with the package 10. Here, the cover 26 and base section 22 are each separately formed using injection or transfer molding.

Referring now to FIGS. 2A through 2E, the method for forming the package 10 will be described. Thus, referring first to FIG. 2A the electrically conductive lead frame 14 is provided. The lead frame 14 has a plurality of sites 40 therein. Each site 40 has: electrical leads 16 extending outwardly from the inner region 18 of the site 40; and, the platform 20. The electrical leads 16 support the platform 20 to the frame 44 within the inner region 18 of the site 40, as shown.

Figure 2A:
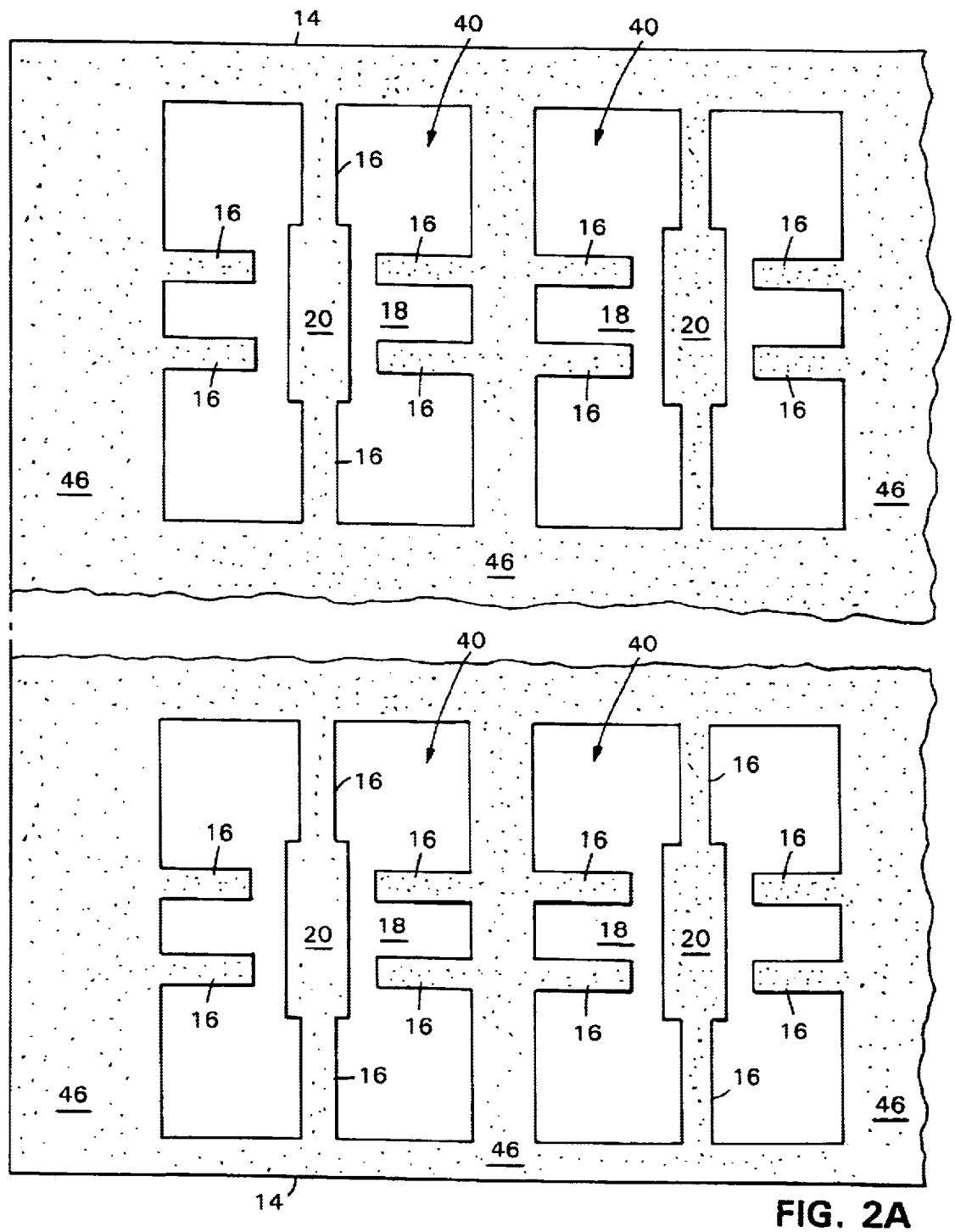
FIGS. 2A through 2E are sketches showing the package of FIGS. 1A and 1B at various stages in the fabrication thereof, FIG. 2A being a plan view of a lead frame used in a first step of the fabrication, FIG. 2B being a cross-sectional elevation sketch showing the relationship between a base of the package of FIG. 1A on an exemplary site of the lead frame of FIG. 2A, FIG. 2C being a cross-sectional elevation sketch showing the relationship between a base section of the package of FIG. 1A on the exemplary site of the lead frame of FIG. 2B after the base and the lead frame have been adhesively affixed together, FIG. 2D being a plan view of the adhesively affixed lead frame and base section, the cross-sectional elevation view of FIG. 2C being taken along line 2C—2C of FIG. 2D, FIG. 2E being a cross-sectional elevation sketch showing the relationship between a cover of the package of FIG. 1A and the adhesively affixed base section and lead frame of FIGS. 2C and 2E prior the to affixation therebetween.
Figure 2B:
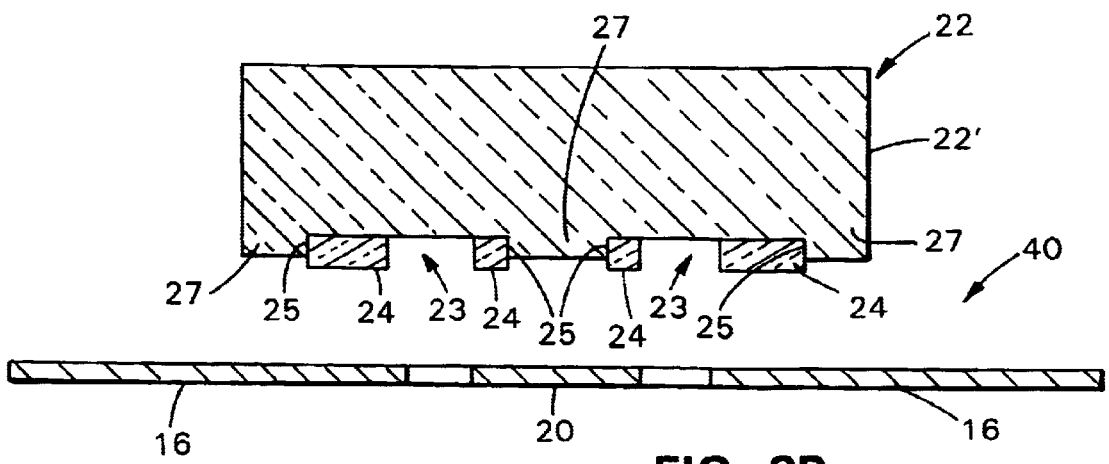

Next, considering an exemplary one of the sites 40, and referring to FIGS. 2B and 2B', each one of a plurality of the dielectric members $22_1$ is disposed over, and affixed to, a corresponding one of the sites 40 using epoxy 24, as shown. More particularly, the dielectric members $22_1$ are affixed to the platform 20 and portions of the electrical leads 16. It is noted that the dielectric members $22_1$ includes a recess, or ridge 23, having side walls 25. Such configuration is provided to increase the surface tension between the applied B-stage epoxy 24 and the dielectric member $22_1$ thereby to prevent the liquid-like epoxy from dripping off of the dielectric member $22_1$.

Figure 2C:
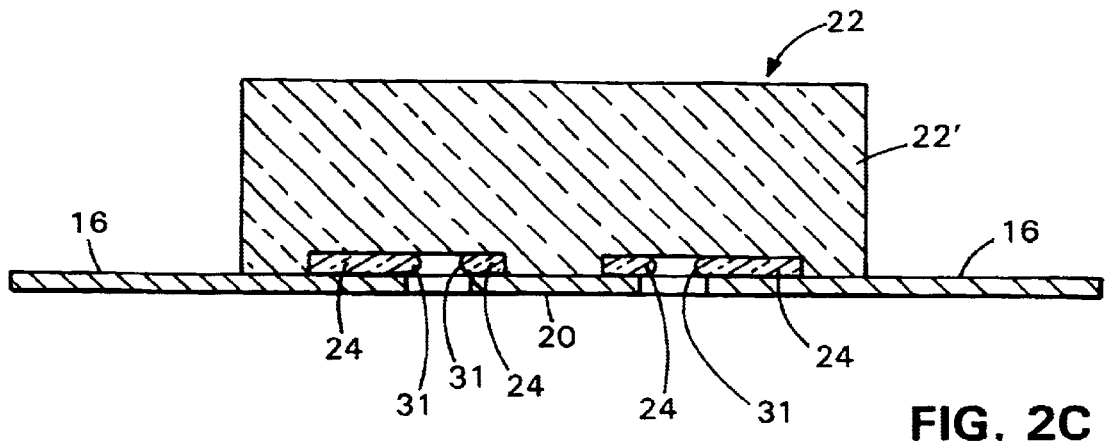
Figure 2D:
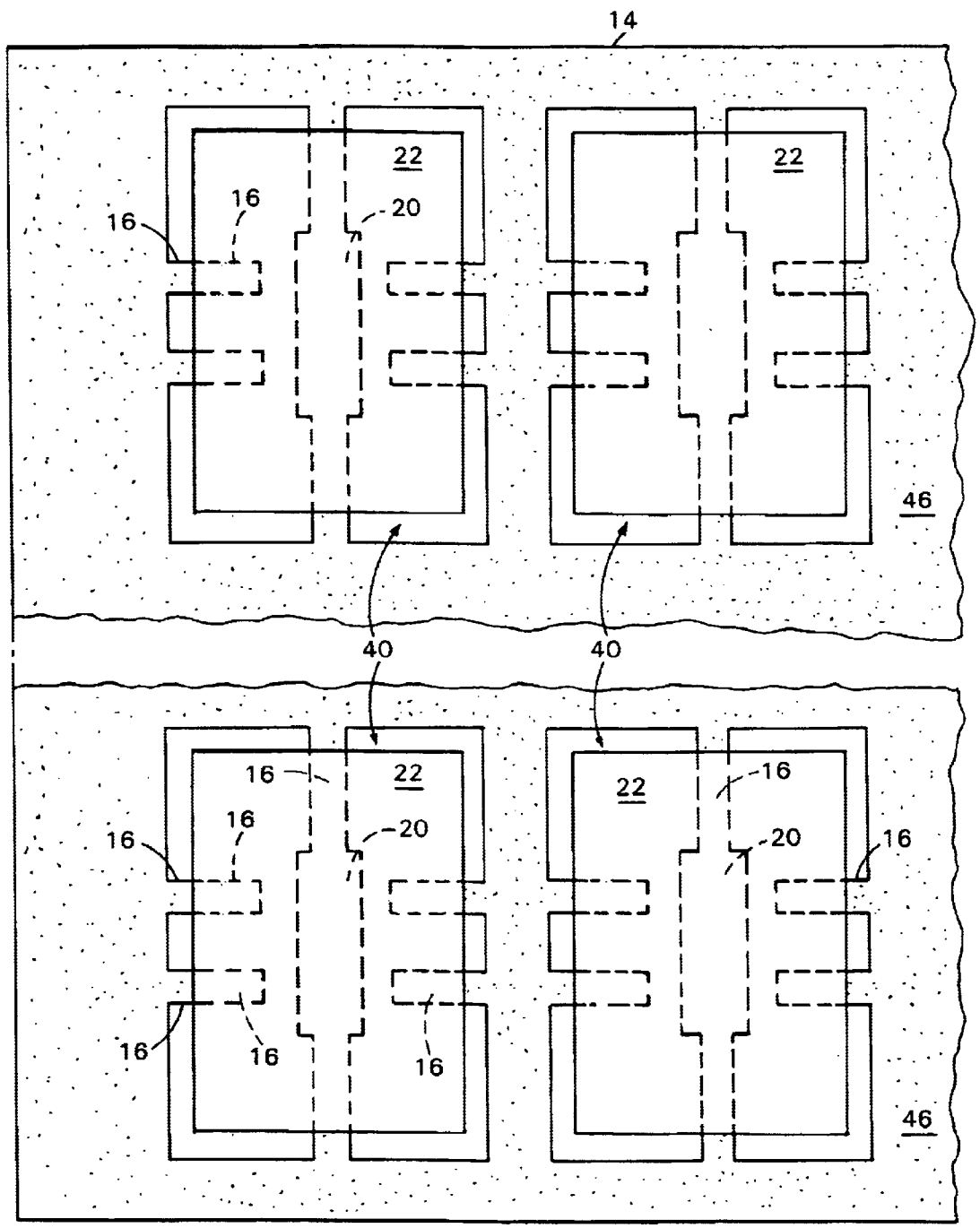

Next, referring to FIGS. 2C and 2D, the lead frame 14 and the dielectric members $22_1$ are pressed together, as shown, and the structure is heated to cure the B-stage epoxy 24. It is noted that the epoxy 24 is thus squeezed downward (i.e., compressed) by the force of the dielectric member $22_1$; however, amount of compression is limited by the legs 27 of ridge 23 formed in the dielectric member $22_1$. More particularly, the dielectric member $22_1$ formed with the ridges 23 and sidewalls 25 by injection or transfer molding. It is also noted that portions 31 of the epoxy 24 are exposed and thereby enable visual observation of the curing process on a sample testing basis after the package has been opened.

Figure 2E:
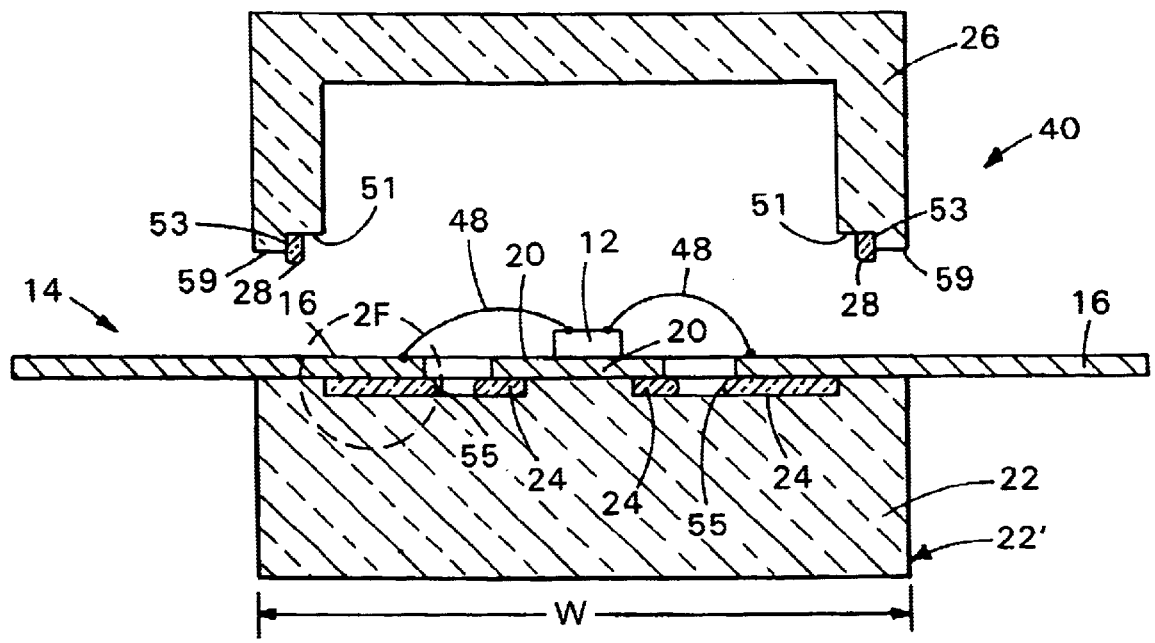

Next, referring to FIG. 2E, the lead frame 14 with the attached dielectric members $22_1$, as shown in FIG. 2D, are turned over. Each one of a plurality of integrated circuit chips 12 adapted to operate at microwave frequencies is mounted to a corresponding one of the plurality of platforms 20, only one being shown at the exemplary one of the sites 40 in FIG. 2E. Next, electrical wires 48 are connected between the integrated circuit chips 12 at each one of the plurality of sites 40 and the electrical leads 16 at the corresponding one of the sites 40.

Next, the covers 26 are affixed to upper portions of the electrical leads 16 and the dielectric member $22_1$ with epoxy 28 to provide the package 10 shown in FIGS. 1A and 1B. Thus, the cover 26 and dielectric member $22_1$ encapsulate each one of the integrated circuit chips 12 and the electrical wires 48 connected thereto within the cavity 30 formed by the corresponding one of the plurality of dielectric members $22_1$ and the corresponding one of the covers 26. More particularly, it is first noted that the covers 26 are again injection or transfer molded plastic and are formed with a ridge 51 and sidewalls 53. Such configuration is provided to increase the surface tension between the applied B-stage epoxy 28 and the cover 26 thereby to prevent the liquid-like epoxy from dripping off of the cover 26. Next, and referring again to FIGS. 1A and 1B, the cover 26 and the lead frame 14 are pressed together, as shown, and the structure is heated to cure the B-stage epoxy 28. It is noted that the epoxy 28 is thus squeezed downward (i.e., compressed) by the force of the cover 26; however, amount of compression is limited by the legs 59 (FIG. 2E) of the ridges 51 formed in the cover 26. It is also noted that portions 55 of the epoxy 28 are exposed and thereby enable visual observation of the curing process on a sample testing basis after the package has been opened.

Finally, the distal portions of the electrical leads 16 are severed from the frame 44 to provide the packaged integrated circuit chip 12 shown in FIGS. 1A and 1B.

Figure 2F:
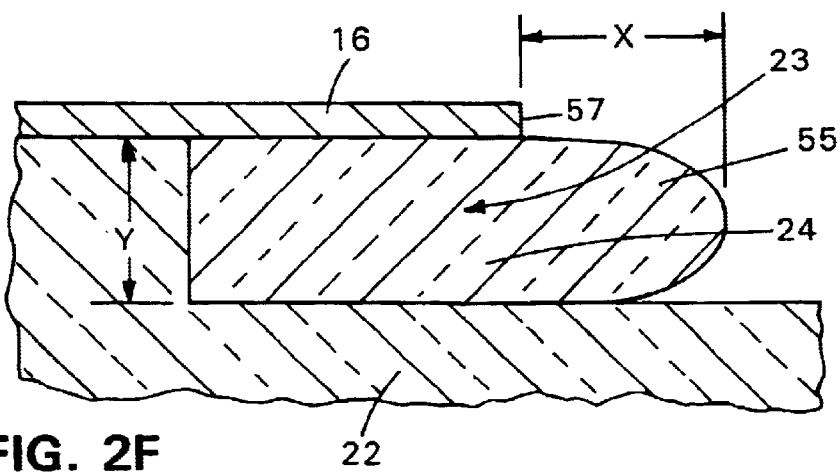
FIG. 2F is an exploded view of a portion of the sketch shown in FIG. 2E, such portion being within a line 2F—2F of FIG. 2E.

Referring to FIG. 2F, ridge 23 is shown in more detail. It is first noted that the epoxy 24 projects from the edge 57 of the electrical leads 16 a length X. Further, the height of the ridge 23 is Y. Here, X is between 1 to 3 mils, here preferably 2 mils. Here, Y is also between 1 to 3 mils, here preferably 2 mils. The width of the package, W, FIG. 2E, is here 150 to 200 mils. Thus, X and Y are in the order of 1% of the width of the package. These same dimensions apply to ridge 51.

Figure 3A:
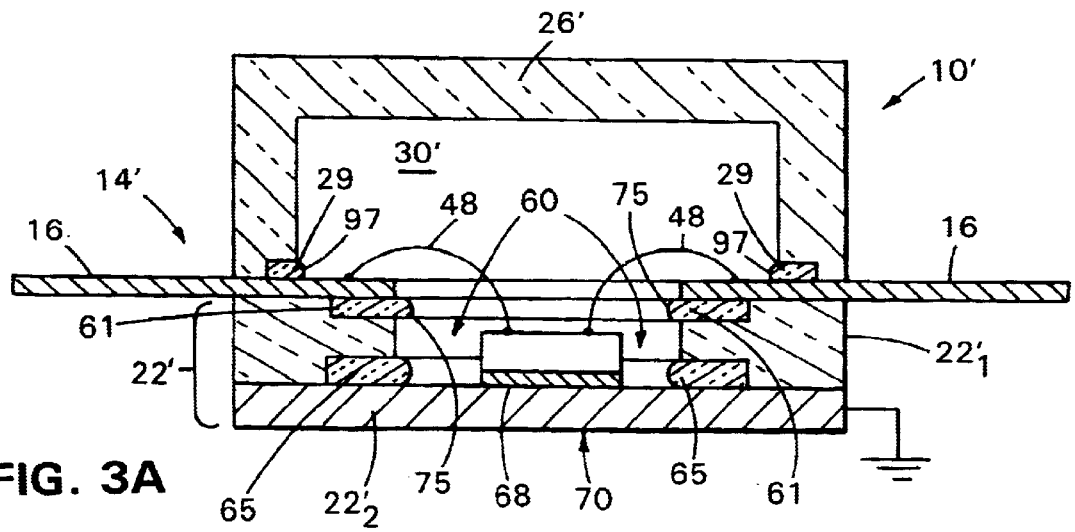
FIG. 3A is a cross-sectional elevation, diagrammatical sketch of a package, according to another embodiment of the invention, for an integrated circuit adapted to operate at microwave frequencies.
Figure 3B:
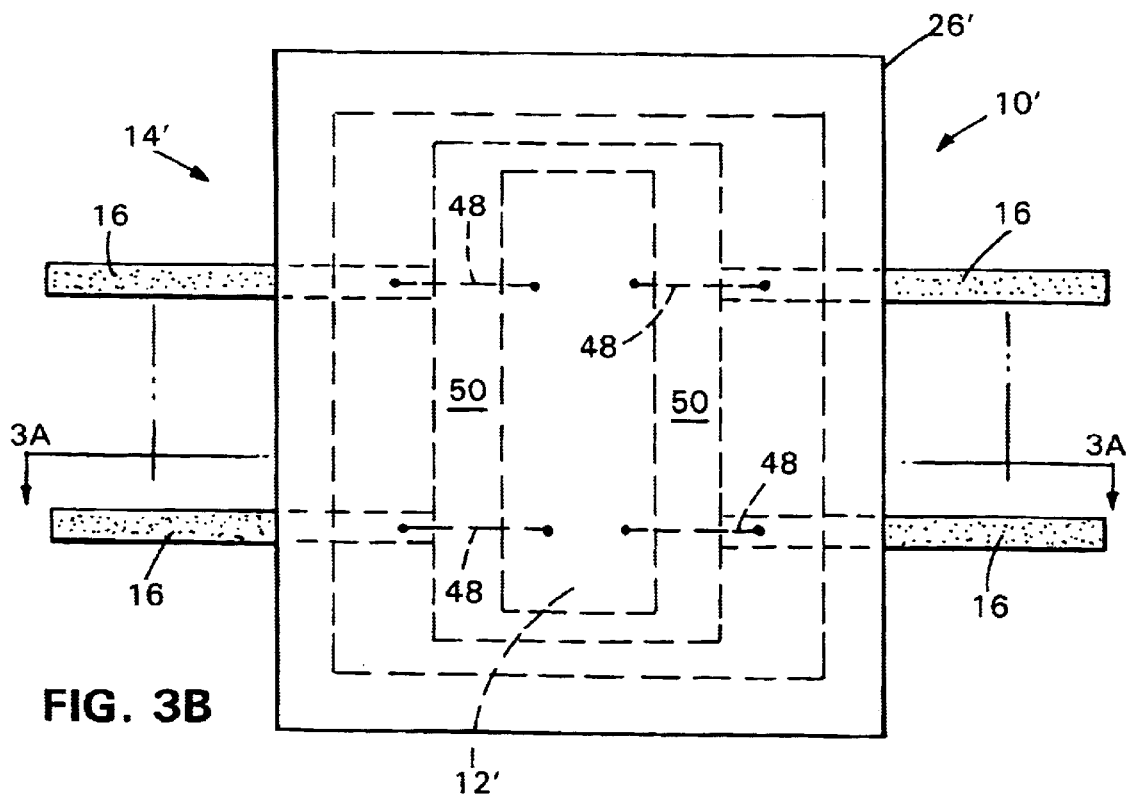
FIG. 3B is a plan view of the package of FIG. 3A, the cross sectional view of FIG. 1A being taken along line 3A—3A of FIG. 1B.

Referring now to FIGS. 3A and 3B, an alternative integrated circuit chip package 10' is shown. Here, the integrated circuit chip package 10' includes an electrically conductive lead frame 14' having electrical leads 16 adapted for electrical connection to the integrated circuit chip 12. It is noted that the lead frame 14' does not have a platform such as platform 20 in FIGS. 1A and 1B. The base section 22' includes a dielectric member $22'_1$ and a conductive member $22'_2$. The dielectric member $22'_1$, having a central aperture 60, is adhesively affixed with a B-sage epoxy 61 to bottom portions of the lead frame 14'. The conductive member $22'_2$ is adhesively affixed to the bottom portions of the dielectric member $22'_1$ with B-stage epoxy 65. The conductive member $22'_2$ has an upper surface portion electrically connected to a bottom ground plane conductor 68 of the integrated circuit chip 12. The integrated circuit chip 12 is disposed in registration with the aperture 60. More particularly, a portion of the integrated circuit chip 12 is positioned with aperture 60, as shown.

The package 10' includes a dielectric cover 26', here plastic. The electrically conductive member $22'_2$ with the attached dielectric 56 and the attached cover 26' are configured to provide an air-filled cavity 30' when the cover 26' and base section 22' are affixed together with the integrated circuit chip 12 being disposed with such provided cavity 30' and with a bottom surface portion 70 of the conductive member $22'_2$ being exposed exteriorly of the package 10', as shown more clearly in FIG. 3A. Thus, the bottom portion 70 of the electrically conductive member $22'_2$ provides a ground plane connector for the ground plane conductor 68 of the integrated circuit chip 12. Again wires 48 are electrically connected between the integrated circuit chip 12 and the electrical leads 16.

Figure 4A:
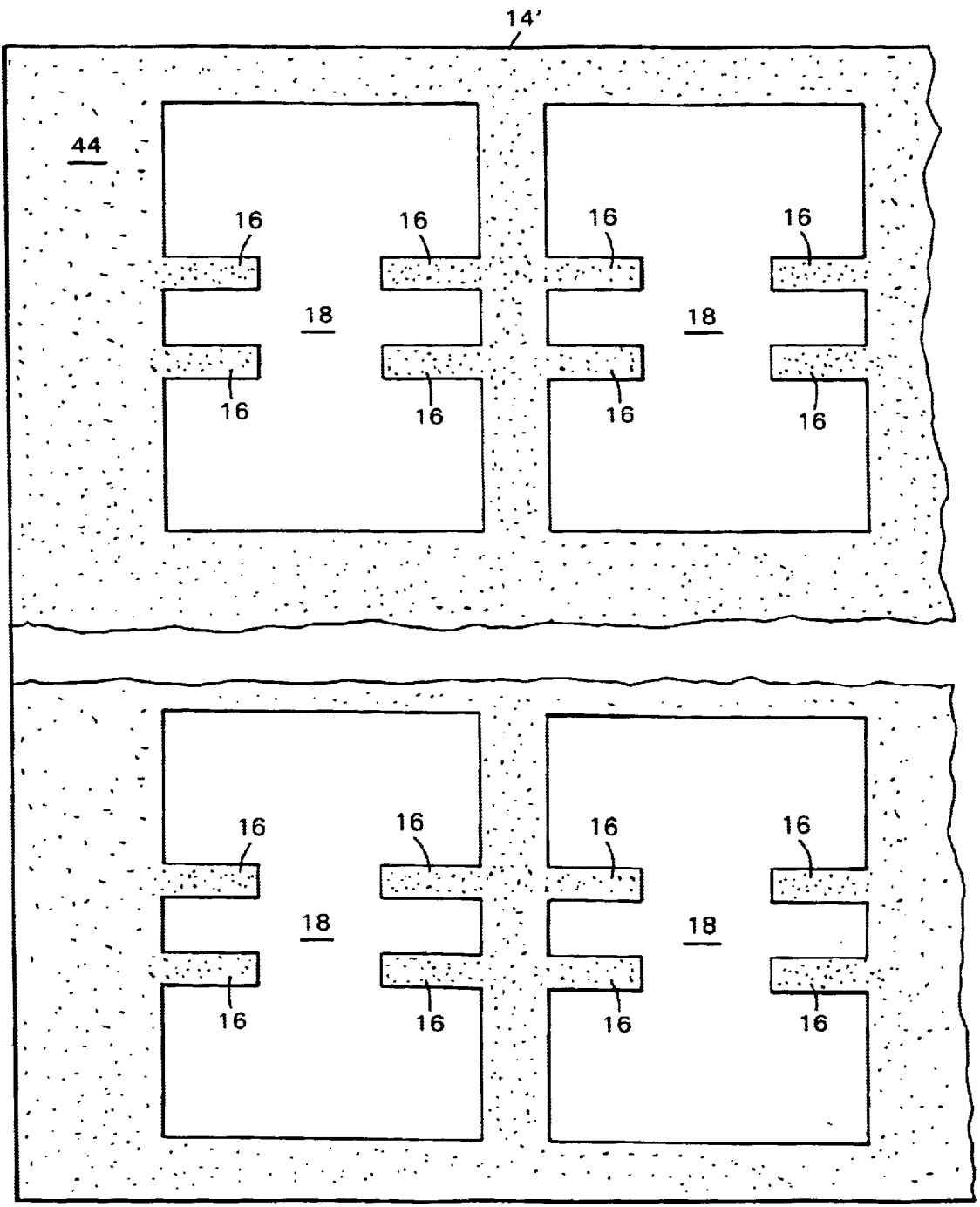
FIGS. 4A through 4F are sketches showing the package of FIGS. 3A and 3B at various stages in the fabrication thereof, FIG. 4A being a plan view of a lead frame used in a first step of the fabrication, FIG. 4B being a cross-sectional elevation sketch showing the relationship between a dielectric member of a base section of the package of FIG. 3A on an exemplary site of the lead frame of FIG. 4A, FIG. 4C being a cross-sectional elevation sketch showing the relationship between the dielectric member of the base section of the package of FIG. 3A on the exemplary site of the lead frame of FIG. 4A after the dielectric member and the lead frame have been adhesively affixed together, FIG. 4D being a cross-sectional elevation sketch showing the relationship between a conductive member of the base section of the package of FIG. 3A and the adhesively affixed dielectric member and lead frame of FIG. 4C.

Referring now to FIGS. 4A through 4F, a method for forming the package 10' shown in FIGS. 3A and 3B will be described. Referring first to FIG. 4A, the lead frame 14' is provided having: electrical leads 16 extending outwardly from an inner region 18 of the lead frame 14'.

Figure 4B:
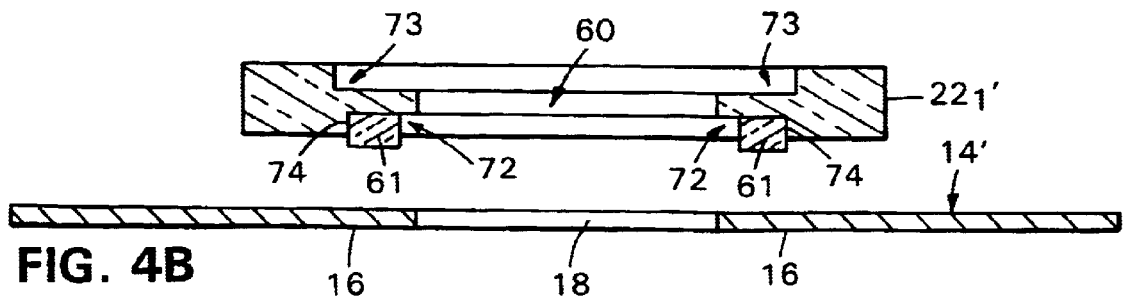
Figure 4C:
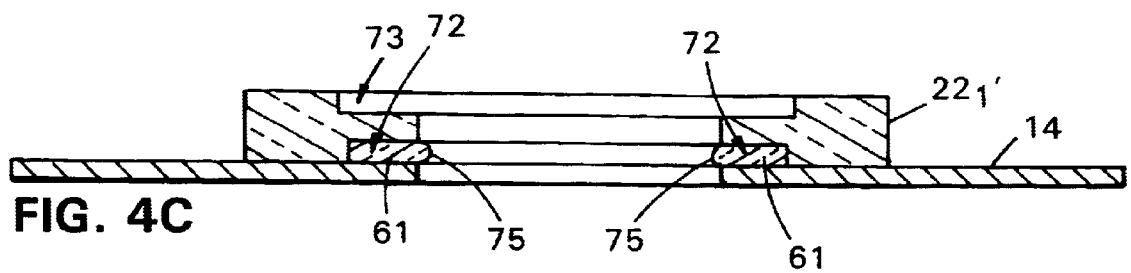

Referring now to FIG. 4B, the plastic dielectric member $22'_1$ having the aperture 60 therein is provided. Here, the dielectric member $22'_1$ is injection or transfer molded with ridges 72, 73 having side walls 74, 75, respectively as shown. Such ridges 72, 73 are formed as described above in connection with FIG. 2F. Such configuration is provided to increase the surface tension between the applied B-stage epoxy 61 and the dielectric member $22'_1$ and B-stage epoxy 65 (FIG. 4D) and the dielectric member $22'_1$ thereby to prevent the liquid-like epoxy from dripping off of the dielectric member $22'_1$. Next, and referring to FIGS. 4C, the dielectric member $22'_1$ and the lead frame 14' are pressed together, as shown, and the structure is heated to cure the B-stage epoxy 61. It is noted that the epoxy 61 is thus squeezed downward (i.e., compressed) by the force of the dielectric member $22'_1$; however, amount of compression is limited by the ridges 72 formed in the dielectric member $22'_1$. It is also noted that portions 75 of the epoxy 61 are exposed and thereby enable visual observation of the curing process adhesively affixed to the lead frame 14' by a B-stage epoxy 61. Again, the epoxy projects beyond the edge of the lead 14', as described above in connection with FIG. 2F.

Figure 4D:
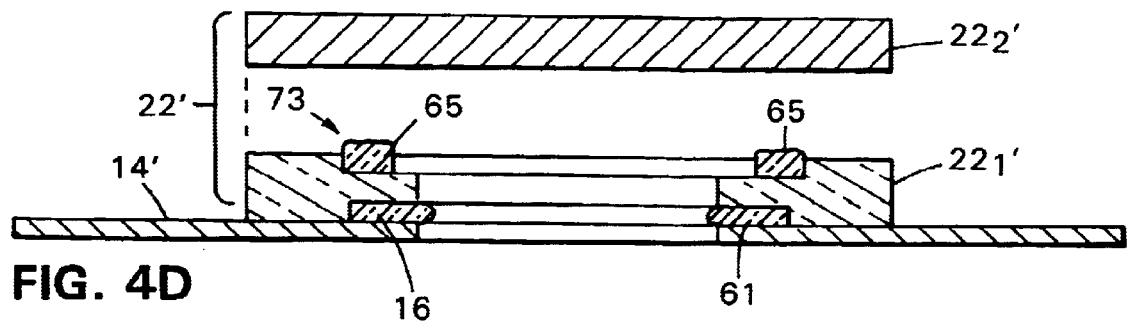
Figure 4E:
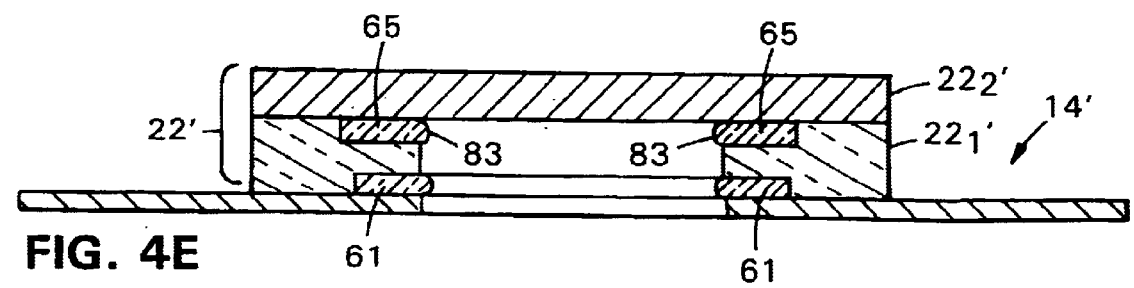

Referring now to FIG. 4D, the conductive member $22'_2$ is provided. The conductive member $22'_2$, is here copper. Next, and referring to FIGS. 4E, the dielectric member $22'_2$ and the dielectric member $22'_1$ are pressed together, as shown, to provide the base section 22' and the structure is heated to cure the B-stage epoxy 65. It is noted that the epoxy 65 is thus squeezed downward (i.e., compressed) by the force of the base section 22'; however, amount of compression is limited by the ridges 73 formed in the dielectric member $22'_1$. It is also noted that portions 83 (FIG. 4E) of the epoxy 65 are exposed and thereby enable visual observation of the curing process. The portion 83 projects as described above in connection with FIG. 2F.

Figure 4F:
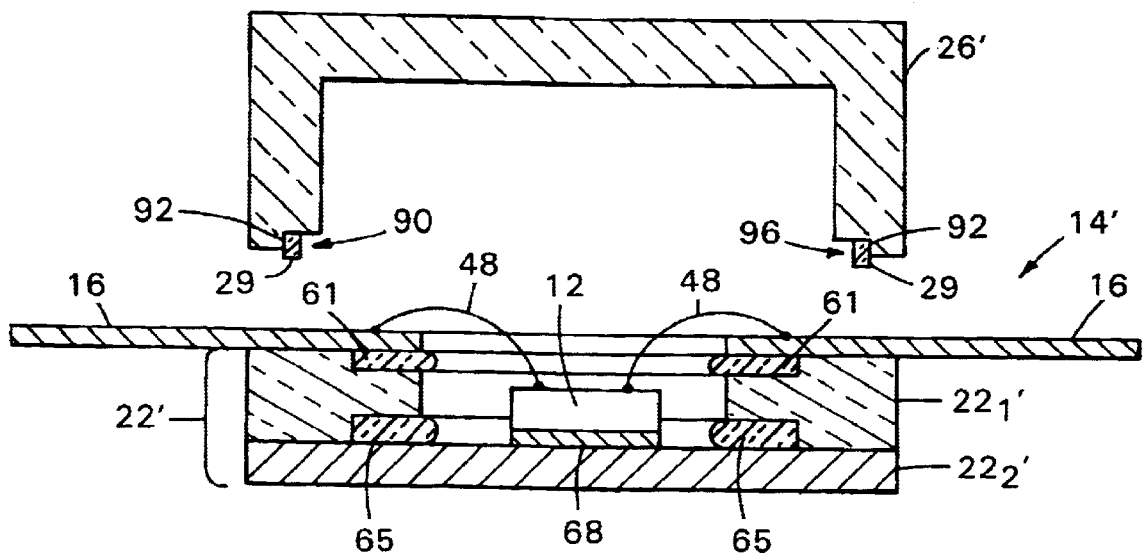

Next, the lead frame 14' is turned over as shown in FIG. 4F. The ground plane conductor 68 of the integrated circuit chip 12 is affixed to the conductive member $22'_2$ with a suitable conductive epoxy, not shown. Electrical wires 48 are connected between the integrated circuit chip 12 and the electrical leads 16. Next, the plastic cover 26' is provided. The plastic cover 26' is injection or transfer molded and is formed with a ridge 90 having sidewalls 92. The B-stage epoxy 29 is applied to the ridge 96, as shown. Such configuration is provided to increase the surface tension between the applied B-stage epoxy 29 and the lead frame 14' to prevent the liquid-like epoxy 29 from dripping off of the cover 26'. Next, and referring to FIGS. 3A and 3B, the cover 26' and lead frame 14' are pressed together, as shown, and the structure is heated to cure the B-stage epoxy 29. It is noted that the epoxy 29 is thus squeezed downward (i.e., compressed) by the force of the cover 26'; however, amount of compression is limited by the ridges 90 (FIG. 4F) formed in the cover 26'. It is also noted that portions 97 of the epoxy 29 are exposed and thereby enable visual observation of the curing process on a sample testing basis after the package has been opened. It is also noted that when the cover 26' and base 22' are affixed to provide the package 10' for the integrated circuit chip 12, such integrated circuit chip 12 is disposed within the cavity 30' formed by the affixed base section 22' and cover 26' and with the bottom portion 70 of the electrically conductive member $22'_2$ being exposed exteriorly of the package 10'.

Finally, the distal portions of the electrical leads 16 are severed from the frame 44 to provide the packaged integrated circuit chip 12 shown in FIGS. 3A and 3B.

Other embodiments are within the spirit and scope of the appended claims.

What is claimed is:

1. A package for an integrated circuit chip adapted to operate at microwave frequencies, comprising:

an electrically conductive lead frame having electrical leads adapted for electrical connection to the integrated circuit;

an adhesive material;

a base section having;

a dielectric member having an upper portion affixed by the adhesive material to the lead frame;

an electrically conductive member;

wherein the dielectric member has an aperture disposed in registration with an inner region of the lead frame and the conductive member has one upper portion thereof affixed by the adhesive material to a bottom portion of the dielectric member and another upper portion electrically connected to a bottom ground plane conductor of the integrated circuit, such integrated circuit chip being disposed in registration with the aperture;

wherein the dielectric member is disposed between the lead frame and the conductive member;

wherein the dielectric member has external sidewalls terminating in a bottom of the dielectric member; and a plastic cover having a bottom surface, a portion of the bottom surface affixed to a top surface portion of the lead frame by the adhesive material;

wherein the base section and the cover are configured to provide a cavity when the cover and the base section are affixed with the integrated circuit chip being disposed with such provided cavity and with and with a bottom surface portion of the conductive member being exposed exteriorly of the package and wherein the adhesive material affixing the cover to the lead frame extends into the cavity along a first direction and is combined within outer surface of sidewalls of such cover along an opposite direction by inner surfaces of said sidewalls of such cover; and wherein ends of the sidewalls are affixed to the base section.

2. The package recited in claim 1 wherein the cover is configured with a ridge disposed along ends of sidewalls of the cover; and including the adhesive material disposed in the ridge between the cover and the lead frame to affix the cover to the lead frame, such recess being in each one of the ends of the sidewalls, each recess having bottom surface and a rear surface to hold the adhesive material allowing a portion of the adhesive material to extend beyond the bottom surface into the cavity along a first direction while the rear surface of such recess retains such adhesive material within the sidewalls of the cover as such material is urge along an opposite direction.

* * * * *

UNITED STATES PATENT AND TRADEMARK OFFICE
CERTIFICATE OF CORRECTION

PATENT NO.     : 6,730,991 B1
DATED          : May 4, 2004
INVENTOR(S)    : Edward C. Douglas Page 1 of 1

It is certified that error appears in the above-identified patent and that said Letters Patent is hereby corrected as shown below:

Title page,
Item [57], ABSTRACT,
Line 12, reads "nd a" and should read -- and a --.
Line 15, reads "electronically to" and should read -- electronically connected to --.

Column 2,
Line 39, reads "method the" and should read -- method, the --.
Line 43, reads "a package an integrated circuit" and should read -- a package to an integrated circuit --.

Column 3,
Line 17, reads "the to" and should read -- to the --.
Line 44, reads "FIG. 4B" and should read -- FIG. 4E --.

Column 4,
Line 44, reads "22, formed" and should read -- 22, is formed --.

Column 5,
Line 38, reads "B-Sage" and should read -- B-Stage --.

Column 6,
Line 4, reads "side walls" and should read -- sidewalls --.

Column 8,
Lines 4-5, reads "and with and with" and should read -- and with --.
Line 6, reads "Package and" and should read -- package; and --.
Line 24, reads "urge" and should read -- urged --.

Signed and Sealed this

Eighth Day of February, 2005

JON W. DUDAS
*Director of the United States Patent and Trademark Office*